US012777723B2

(12) United States Patent
Lin et al.

(10) Patent No.: US 12,777,723 B2
(45) Date of Patent: Oct. 27, 2026

(54) DISPLAY PANEL WITH DUAL-LAYER FAN-OUT WIRING AND FLOATING-PAD-FREE BONDING AREA, AND DISPLAY DEVICE

(71) Applicant: Xiamen Tianma Micro-Electronics Co., Ltd., Xiamen (CN)

(72) Inventors: Yiqiang Lin, Xiamen (CN); Hao Wu, Xiamen (CN); Poping Shen, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 354 days.

(21) Appl. No.: 18/408,947

(22) Filed: Jan. 10, 2024

(65) Prior Publication Data

US 2025/0048733 A1 Feb. 6, 2025

(30) Foreign Application Priority Data

Aug. 1, 2023 (CN) ......................... 202310957424.6

(51) Int. Cl.
*H10D 86/60* (2025.01)
*H10D 86/40* (2025.01)

(52) U.S. Cl.
CPC ........... *H10D 86/60* (2025.01); *H10D 86/441* (2025.01)

(58) Field of Classification Search
CPC ..... H10D 86/60; H10D 86/441; H10K 59/131
USPC ............................................................ 257/59
See application file for complete search history.

(56) References Cited

U.S. PATENT DOCUMENTS

2021/0310148 A1* 10/2021 Lapelosa ................... C25F 1/04
2021/0357094 A1* 11/2021 Qiao ....................... G06F 3/044

FOREIGN PATENT DOCUMENTS

CN 108415601 B 12/2020
CN 112051691 B 4/2022

* cited by examiner

*Primary Examiner* — Duy T Nguyen
(74) *Attorney, Agent, or Firm* — Anova Law Group, PLLC

(57) ABSTRACT

Display panel and electronic device are provided. The display panel includes a display area, a first wiring area, a fan-out area, and a bonding area on a side of the display area along a first direction. The first wiring area is between the fan-out area and the display area, and the bonding area is on a side of the fan-out area away from the first wiring area. The display area includes a plurality of signal lines extending along the first direction and arranged along a second direction. The first wiring area includes a plurality of signal leads extending along the first direction and arranged along the second direction. The fan-out area includes a plurality of fan-out lines. The bonding area includes a plurality of bonding pads arranged along the second direction.

17 Claims, 10 Drawing Sheets

DISPLAY PANEL WITH DUAL-LAYER FAN-OUT WIRING AND FLOATING-PAD-FREE BONDING AREA, AND DISPLAY DEVICE

CROSS-REFERENCE TO RELATED APPLICATION

This application claims priority of Chinese Patent Application No. 202310957424.6, filed on Aug. 1, 2023, the entire contents of which are hereby incorporated by reference.

FIELD OF THE DISCLOSURE

The present disclosure generally relates to the field of display technology and, more particularly, relates to a display panel, and a display device.

BACKGROUND

From an era of cathode ray tube (CRT) to an era of liquid crystal display (LCD), and now to an era of organic light-emitting diode (OLED) and an era of light-emitting diode display, the display industry has experienced decades of development and is changing with each passing day. The display industry has been closely related to our daily lives, from traditional mobile phones, tablets, TVs and PCs to current smart wearable devices, VR, car displays, and other electronic devices are inseparable from display technology.

In a related art, a feasible implementation involves arranging a display panel with bonding pads for bonding with pads on a control chip to control the display panel. The control chip is generally provided by ae chip manufacturer. The pads on the control chip have a relatively fixed arrangement and are difficult to customize according to a wiring layout in each display panel. Therefore, bonding pads of the display panel may not match the pads on the control chip, which affects effective utilizations of the bonding pads on the display panel and the pads on the control chip.

BRIEF SUMMARY OF THE DISCLOSURE

One aspect of the present disclosure provides a display panel. The display panel includes a display area, a first wiring area, a fan-out area, and a bonding area on a side of the display area along a first direction. The first wiring area is between the fan-out area and the display area, and the bonding area is on a side of the fan-out area away from the first wiring area. The display area includes a plurality of signal lines extending along the first direction and arranged along a second direction. The first wiring area includes a plurality of signal leads extending along the first direction and arranged along the second direction. The fan-out area includes a plurality of fan-out lines. The bonding area includes a plurality of bonding pads arranged along the second direction.

Another aspect of the present disclosure provides a display device including a display panel. The display panel includes a display area, a first wiring area, a fan-out area, and a bonding area on a side of the display area along a first direction. The first wiring area is between the fan-out area and the display area, and the bonding area is on a side of the fan-out area away from the first wiring area. The display area includes a plurality of signal lines extending along the first direction and arranged along a second direction. The first wiring area includes a plurality of signal leads extending along the first direction and arranged along the second direction. The fan-out area includes a plurality of fan-out lines. The bonding area includes a plurality of bonding pads arranged along the second direction.

Other aspects of the present disclosure can be understood by a person skilled in the art in light of the description, the claims, and the drawings of the present disclosure.

BRIEF DESCRIPTION OF THE DRAWINGS

Accompanying drawings, which are incorporated into and constitute a part of the present specification, illustrate embodiments of the present disclosure and together with the description, serve to explain principles of the present disclosure.

DETAILED DESCRIPTION

Various exemplary embodiments of the present disclosure will be described in detail with reference to the accompanying drawings. It should be noted that, unless specifically stated otherwise, a relative arrangement of components and steps, numerical expressions and numerical values set forth in the embodiments do not limit the scope of the present disclosure.

The following description of at least one exemplary embodiment is merely illustrative and is not intended to limit the present disclosure and application or use thereof.

Techniques, methods, and apparatus known to a person skilled in the art may not be discussed in detail, but where appropriate, such techniques, methods, and apparatus should be considered as part of the present specification.

In all examples shown and discussed herein, any specific value should be construed as illustrative only and not as a limitation. Accordingly, other examples of exemplary embodiments may have different values.

It will be apparent to a person skilled in the art that various modifications and variations can be made in the present disclosure without departing from the spirit or scope of the present disclosure. Accordingly, the present disclosure is intended to cover the modifications and variations of the present disclosure that fall within the scope of corresponding claims (claimed technical solutions) and equivalents thereof. It should be noted that implementations provided in the embodiments of the present disclosure may be combined with each other if there is no contradiction.

It should be noted that similar numerals and letters refer to similar items in the following accompanying drawings. Once an item is defined in one accompanying drawing, the item does not require further discussion in subsequent accompanying drawings.

Figure 1:
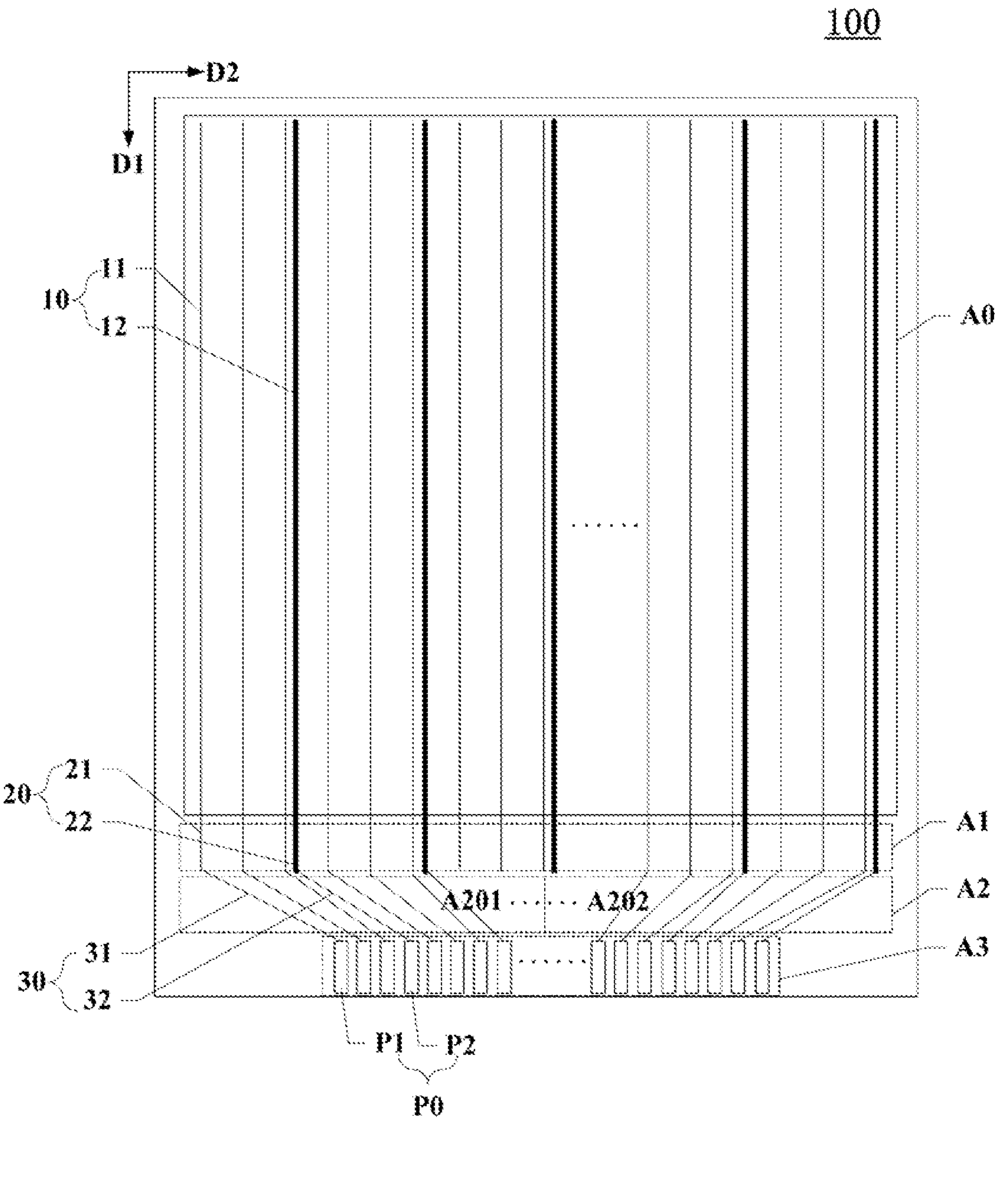
FIG. 1 illustrates a schematic diagram of a display panel consistent with various embodiments of the present disclosure.
Figure 2:
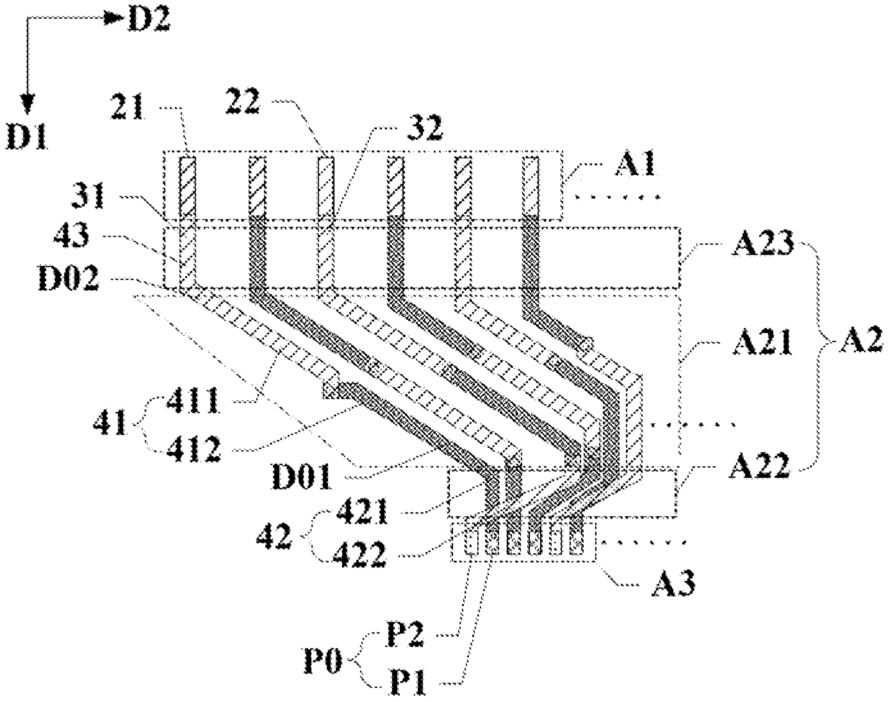
FIG. 2 illustrates a wiring diagram of a first wiring area, a fan-out area and a bonding area.
Figure 3:
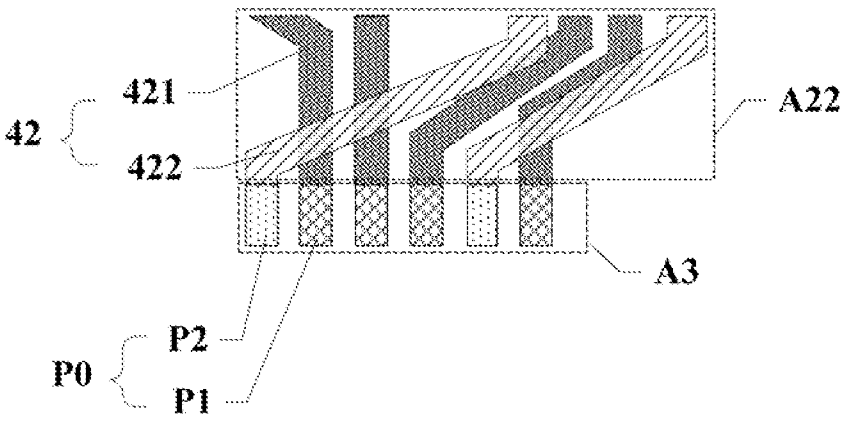
FIG. 3 illustrates an enlarged diagram of a second fan-out area and a bonding area in FIG. 2.

FIG. 1 illustrates a schematic diagram of a display panel consistent with various embodiments of the present disclosure. FIG. 2 illustrates a wiring diagram of a first wiring area, a fan-out area, and a bonding area. FIG. 3 illustrates an enlarged diagram of a second fan-out area and a bonding area in FIG. 2. Referring to FIGS. 1-3, in one embodiment, a display panel includes a display area A0, a first wiring area A1 on a side of the display area A0 along a first direction D1, a fan-out area A2 and a bonding area A3. The first wiring area A1 is between the fan-out area A2 and the display area A0. The bonding area is on a side of the fan-out area A2 away from the first wiring area A1.

The display area A0 includes M first signal lines 11 and S second signal lines 12 extending along the first direction D1 and arranged along a second direction D2, the first direction D1 intersects the second direction D2. The first wiring area A1 includes N first leads 21 and P second leads 22 extending along the first direction D1 and arranged along the second direction D2. The first leads 21 are electrically connected to the first signal lines 11, the second leads 22 are electrically connected to the second signal lines 12, M, N, S and P are all integers greater than 1, and N≤M, P≤S.

The fan-out area A2 includes a plurality of fan-out lines 30 including N first fan-out lines 31 and P second fan-out lines 32. The plurality of first fan-out lines 31 are electrically connected to the first leads 21, the second fan-out lines 32 are electrically connected to the second leads 22. At least part of line segments in the first fan-out line 31 and at least part of line segments in the second fan-out line 32 are arranged in a same layer.

The bonding area A3 includes a plurality of bonding pads P0 arranged along the second direction D2. The plurality of bonding pads P0 includes N first bonding pads P1 connected to the first fan-out line 31 and P second bonding pads P2 connected to the second fan-out line 32. Along the second direction D2, no floating pads are arranged between adjacent first bonding pads P1, between adjacent second bonding pads P2, or between adjacent first bonding pads P1 and second bonding pads P2.

It should be noted that FIG. 1 only illustrates a schematic diagram of the first signal lines 11 and the second signal lines 12 on the display panel and does not limit number of first signal lines 11 and second signal lines 12 actually included in the display panel. A layout of the fan-out lines in the fan-out area A2 in FIG. 1 is only for illustration, and a specific wiring method of the fan-out lines can refer to FIG. 2. FIG. 2 schematically illustrates film layers where the fan-out lines 30 are located through different fillings and does not limit number and size of the fan-out lines 30. In FIG. 2, the first bonding pads P1 and the second bonding pads P2 are distinguished by different fillings, and actual number and size of the bonding pads P0 are not limited.

It should also be noted that, one implementation to realize electrical connections between the first leads 21 and the first signal lines 11 is that the first leads 21 and the first signal lines 11 are directly electrically connected without any other intermediate connection structures between the first leads 21 and the first signal lines 11. Another implementation to realize electrical connections between the first leads 21 and the first signal lines 11 is that intermediate connection structures are arranged between the first leads 21 and the first signal lines 11, and the first lead 21 and the first signal line 11 are electrically connected through the intermediate connection structures. Similarly, when the second leads 22 are electrically connected to the second signal lines 12, the second leads 22 and the second signal lines may be electrically connected directly or through intermediate connection structures. FIG. 1 only takes a method in which the first leads 21 are directly electrically connected to the first signal lines 11 and the second leads 22 are directly electrically connected to the second signal line 12*s* as an example. A method of connecting the first leads 21 to the first signal lines 11 through intermediate connection structures will be described in subsequent embodiments. A method of connecting the second leads 21 to the second signal lines 12 through intermediate connection structures will also be described in subsequent embodiments.

Referring to FIG. 1 and FIG. 2, in one embodiment, the first wiring area A1, the fan-out area A2 and the bonding area A3 are arranged on a side of the display area A0 in the display panel. The display area A0 is arranged with first signal lines 11 and second signal lines 12 extending along the first direction D1 and arranged along the second direction D2. The first signal lines 11 are electrically connected to the first leads 21 in the first wiring area A1, and the second signal lines 12 are electrically connected to the second leads 22 in the first wiring area A1. The first leads 21 are electrically connected to the first bonding pads P1 in the bonding area A3 through the first fan-out lines 31 in the fan-out area A2. The second leads 22 are electrically connected to the second bonding pads P2 in the bonding area A3 through the second fan-out lines 32 in the fanout area A2, thereby realizing electrical connections between the first signal lines 11 in the display area A0 and the first bonding pads P1 in the bonding area A3, and realizing electrical connections between the second signal lines 12 in the display area A0 and the second bonding pads P2 in the bonding area A3. It should be noted that the embodiment provides two signal lines, namely the first signal lines 11 and the second signal lines 12, and also provides the first leads 21, the first fan-out lines 31 and the first bonding pads P1 connected to the first signal lines 11, and the second leads 22, the second fan-out lines 32 and the second bonding pads P2 connected to the second signal lines 12. The first signal lines 11 and the second signal lines 12 are respectively configured to transmit different types of signals, for example, one transmits data signals, the other transmits touch signals, respectively corresponding to display functions and touch functions of the display panel.

A non-display area of the display panel does not need to be arranged with touch-related structures or some electrode structures. For example, in a lower border area on a side of the display area which is arranged with a fan-out area and a bonding area in the non-display area, usually only some signal lines need to be arranged to transmit signals. Therefore, the lower frame area is thinner than other areas of the display panel. In the embodiment, at least part of the line segments in the first fan-out lines 31 and at least part of the line segments in the second fan-out lines 32 are arranged in a same layer, which reduces number of film layers occupied by the first fan-out lines 31 and the second fan-out lines 32 on the display panel, thereby reducing a thickness of the display panel in the lower frame area of the display panel. Considering that the bonding area in the lower frame area is bonded to a flexible circuit board or a control chip, when the thickness of the lower frame area is reduced, a difference in thickness between the lower frame area and other areas of the display panel creates a space for bonding the control chip or flexible circuit board, so that the thickness of the lower frame area after binding the control chip or flexible circuit board is same or nearly same as a thickness of other areas, which is conducive to improving an overall thickness uniformity of the display panel. Moreover, reducing number of film layers in the bonding area of the display panel simplifies a forming process and save production costs.

Figure 4:
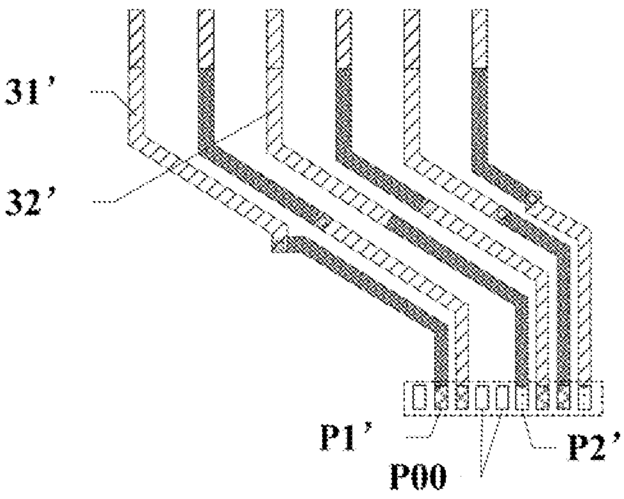
FIG. 4 illustrates a connection diagram of fan-out lines and bonding pads.

FIG. 4 illustrates a connection diagram of fan-out lines and bonding pads. When at least part of line segments of the first fan-out line 31' and the second fan-out line 32' are arranged in a same layer, and the first fan-out lines 31' and the second fan-out lines 32' are electrically connected to the first bonding pads P1' and the second bonding pads P2' respectively, preventing interference between the first fan outlet lines 31' and the second fan outlet lines 32' may result in some bonding pad positions being vacant, giving rise to a presence of floating pads P00. The floating pad P00 refers to pads in the bonding area that are not connected to the signal lines and do not play a role of signal transmission. A size of a floating pad is same as a size of a first bonding pad P1' or a second bonding pad P2' and an only difference between the floating pad and the bonding pad is that the floating pad does not transmit an effective signal. The more floating pads, the lower a pad utilization rate. Shaking and oscillation are prone to occur, resulting in excess power consumption. In addition, when the pad utilization is low, a total number of effective pads and floating pads in the bonding area may be larger, resulting a larger space occupied by the bonding area. Since the bonding area is configured to bond with the control chip or flexible circuit board, when there is a large number of pads and a large amount of space in the bonding area, number of pads and an occupied space on a corresponding control chip or flexible circuit board may be large, which may undoubtedly increase production costs of the control chip or flexible circuit board. Referring to FIG. 1 and FIG. 2, in one embodiment, after the first fan-out lines 31 and the second fan-out lines 32 are respectively bound to the first bonding pads P1 and the second bonding pads P2, along the second direction D2, floating pads that do not transmit valid signals are not arranged between adjacent first bonding pads P1, between adjacent second bonding pads P2, and between adjacent first bonding pads P1 and second bonding pads P2, which greatly reduce number of floating pads in the display panel, thereby effectively improving an effective utilization of the pads on the display panel and the pads on the control chip or flexible circuit board bound to the bonding area A3 of the display panel, and is conducive to reducing or avoiding shaking and oscillation of the display panel and saving power consumption. In addition, as the effective utilization rate of the pads on the control chip or the flexible circuit board is increased, production costs of the control chip or the flexible circuit board, and an overall production cost of the display panel are reduced.

It should be noted that, in one embodiment, when no other pads are arranged between two first bonding pads P1, the two first bonding pads P1 can be regarded as adjacent. When no other pads are arranged between two second bonding pads P2, the two second bonding pads P2 can be regarded as adjacent. When no other pads are arranged between a first bonding pad P1 and a second bonding pad P2, the first bonding pad P1 and the second bonding pad P2 can be regarded as adjacent.

Figure 5:
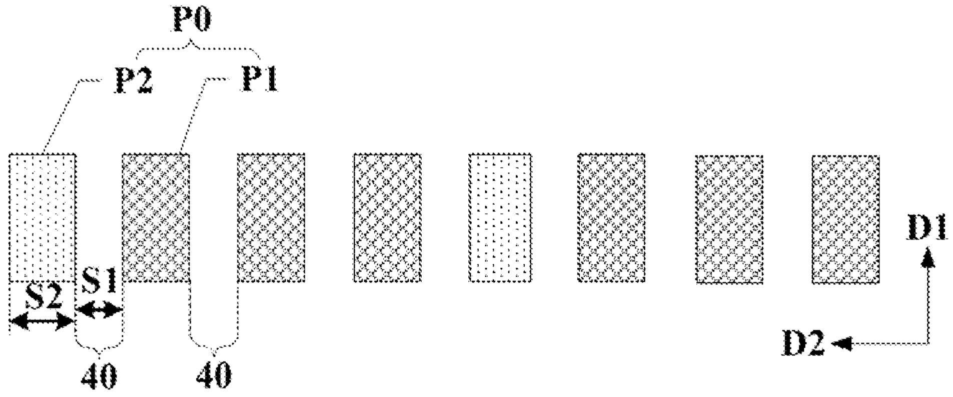
FIG. 5 illustrates a layout diagram of bonding pads in a bonding area.

FIG. 5 illustrates a layout diagram of bonding pads P0 in bonding area A3. In one optional embodiment, a first interval 40 is between adjacent bonding pads P0 arranged along the second direction D2. Along the second direction D2, a width S1 of the first interval 40 is less than or equal to a width S2 of a single bonding pad P0.

Specifically, the bonding pads P0 in the bonding area A3 are arranged along the second direction D2. Optionally, the first bonding pads P1 and the second bonding pads P2 have a same width along the second direction D2. A first interval 40 is between adjacent bonding pads P0 along the second direction D2, that is, a first interval 40 is between adjacent first bonding pads P1, between adjacent second bonding pads P2, and between adjacent first bonding pad P1 and second bonding pad P2. A width of the first interval 40 is less than or equal to a width of a single bonding pad P0. Therefore, no other pads can be arranged at the first intervals 40. That is, no additional floating pads can be arranged between the adjacent first bonding pads P1, between the adjacent second bonding pads P2, and between adjacent first bonding pads P1 and second bonding pads P2, which is conducive to improving the effective utilization of the pads in the bonding area A3.

Optionally, the width S1 of a first interval 40 between any two adjacent bonding pads P0 along the second direction D2 is same. That is, the bonding pads P0 are arranged at equal intervals, which is conducive to simplifying a forming difficulty of the bonding pads P0 and a production process of the display panel and improving a production efficiency of the display panel.

Referring to FIGS. 1, 2 and 5, in an optional embodiment, the second bonding pads P2 are interspersed and arranged between the first bonding pads P1 along the second direction D2.

Specifically, when the first signal lines 11 and the second signal lines 12 are arranged in the display area A0, the second signal lines 12 are interspersed and arranged between the first signal lines 11. Since the first signal lines 11 ultimately need to be electrically connected to the first bonding pads P1 through the first fan-out lines 31, and the second signal lines 12 ultimately need to be electrically connected to the second bonding pads P2 through the second fan-out lines 32, the second bonding pad P2 being interspersed and arranged between the first bonding pad P1 is adapted to an arrangement of the first signal lines 11 and the second signal lines 12, which is conducive to avoiding a relatively large winding of the first fan-out lines 31 or the second fan outlet lines 32 and reducing a wiring difficulty of the fan-out area A2 and improving a production efficiency of the display panel.

Figure 6:
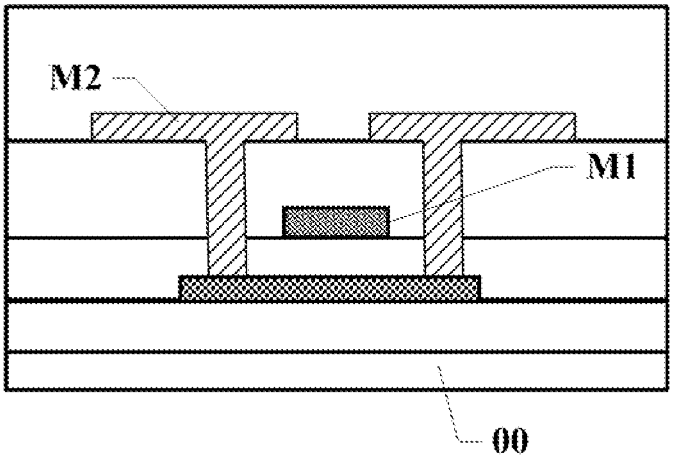
FIG. 6 illustrates a schematic diagram of a film layer of a display panel consistent with various embodiments of the present disclosure.

FIG. 6 illustrates a schematic diagram of a film layer of a display panel consistent with various embodiments of the present disclosure. In one embodiment, the display panel includes a substrate and a first metal layer M1 and a second metal layer M2 provided on a side of a substrate 00. Optionally, the first metal layer M1 is a gate metal layer, and the second metal layer M2 is a source and drain metal layer. Gates of transistors in the display panel are in the first metal layer M1 and sources and drains of the transistors are in the second metal layer M2. Referring to FIG. 1 and FIG. 6, in one optional embodiment, the first signal lines 11 and the second signal lines 12 are arranged in a same layer. Optionally, both the first signal lines 11 and the second signal lines 12 are in the second metal layer M2. Arranging the first signal lines 11 and the second signal lines 12 in a same layer eliminates a necessity of introducing separate metal layers for the first signal lines 11 and the second signal lines 12. Eliminating the necessity for introducing new metal layers to the display panel not only reduces number of metal layers and mask processes in a forming process but also streamlines the forming process and enhances an overall quality of the display panel. In addition, when number of metal layers in the display panel is reduced, a thickness of the display panel is reduced accordingly, which is conducive to realizing a thin design of the display panel. Moreover, when metal layers in the display area only consist of two metal layers such as a first metal layer and a second metal layer, since the lower frame area typically only requires a few signal lines for signal transmission, number of metal layers in the fan-out area in the lower frame area may only be less than or equal to number of metal layers in the display area. That is, number of metal layers configured to lay out fan-out lines is less than or equal to 2. Therefore, as shown in FIG. 4, in a related art, a possibility of interference between the first fan-out lines 31' and the second fan-out lines 32' may be greater, and number of floating pads may be larger. Therefore, along the second direction D2, no floating pads are arranged between adjacent first bonding pads P1, between adjacent second bonding pads P2, and between adjacent first bonding pads P1 and second bonding pads P2 pads, which greatly reduces number of floating pads in the display panel, thereby effectively improving an effective utilization rate of the pads on the display panel and the control chip or the pads on the flexible circuit board bound to the bonding area A3 of the display panel.

Figure 7:
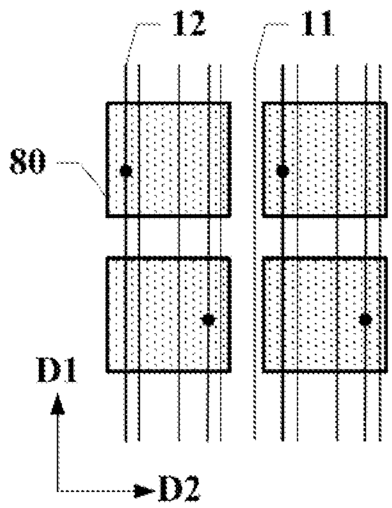
FIG. 7 illustrates an arrangement diagram of touch electrodes, first signal lines and second signal lines in a display panel.

FIG. 7 illustrates an arrangement diagram of touch electrodes 80, first signal lines 11 and second signal lines 12 in a display panel. FIG. 7 only illustrates part of the touch electrodes 80 in the display panel and does not limit an actual number and size of the touch electrodes 80. Referring to FIG. 1 and FIG. 7, in one optional embodiment, the first signal lines 11 are data lines, and the second signal lines 12 are touch signal lines. Alternatively, the first signal lines 11 are touch signal lines, and the second signal lines 12 are data lines. When the touch electrodes 80 are introduced into the display panel, the display panel has touch functions. The touch electrodes 80 are electrically connected to the touch signal lines, and touch signals are transmitted through the touch signal lines. The data lines are configured to be electrically connected to sub-pixels in the display panel and provide data signals to the sub-pixels. In one embodiment, one of the first signal lines 11 and the second signal lines 12 serves as data lines, and the other functions as touch signal lines. Optionally, number of touch signal lines is less than number of data lines. In one embodiment, the data lines and the touch signal lines are arranged in a same layer, which is conducive to simplifying a film layer structure of the display panel and reducing masking processes in a forming process and improving a production efficiency of the display panel.

Referring to FIGS. 1, 2 and 6, in one optional embodiment, the display panel includes a substrate 00 and a first metal layer M1 and a second metal layer M2 arranged on a same side of the substrate. In the fan-out area A2, the fan-out lines 30 are distributed in the first metal layer M1 and the second metal layer M2.

Specifically, the fan-out lines 30 are distributed in the first metal layer M1 and the second metal layer M2, which means that the first fan-out lines 31 have line segments arranged in the first metal layer M1 and the second metal layer M2, and the second fan-out lines 32 have line segments arranged in the first metal layer M1 and the second metal layer M2.

If the first signal lines 11 and the second signal lines 12 are both in the second metal layer M2 and the first fan-out lines 31 connected to the first signal lines 11 and the second fan-out lines 32 connected to the second signal lines 12 are both arranged in the second metal layer M2, number of wirings in the second metal layer M2 in the fan-out area A2 is larger. When the first fan-out lines 31 and the second fan-out lines 32 are electrically connected to the bonding pads P0 of the bonding area A3, a spacing between adjacent fan-out lines 30 decreases on a side near the bonding area A3, number of fan-out lines 30 increases, thereby inevitably increasing a difficulty of wiring the fan-out lines 30. In addition, because different metal layers in the display panel are used to configure structures with different functions and can be made of different materials based on electrical signal requirements, impedances of different metal layers may be different. In a common display panel, the first metal layer M1 is configured to arrange gates of transistors, and the second metal layer M2 is configured to arrange sources and drains of the transistors. Optionally, the first metal layer M1 includes metal Mo, and the second metal layer M2 is composed of a stack of multi-layer metals, such as metal Mo—Al—Mo. Therefore, an impedance of metals in the first metal layer M1 is quite different from an impedance of metals in the second metal layer M2. For example, the impedance of the metals in the first metal layer M1 may be 5 to 6 times the impedance of the metals in the second metal layer M2. If the first fan-out lines 31 are all arranged to the first metal layer M1 and the second fan-out lines 32 are arranged to the second metal layer M2, an overall impedance of the first signal lines 11 and the first fan-out lines 31 becomes relatively large, affecting a signal transmission of the first signal lines 11. If the first fan-out lines 31 are all arranged in the second metal layer M2 and the second fan-out lines 31 are all arranged in the first metal layer M1, an overall impedance of the second signal lines 12 and the second fan-out lines 32 becomes relatively large, affecting a signal transmission of the second signal lines 12.

Therefore, in one embodiment, when part of line segments of each first fan-out line 31 are arranged in the first metal layer M1, part of line segments of each first fan-out line 31 are arranged in the second metal layer M2, and part of line segments of each second fan-out line 32 are arranged in the first metal layer M1, part of line segments of each second fan-out line 32 are arranged in the second metal layer M2, both the first fan-out lines 31 and the second fan-out lines 32 are laid out in a double-layer wiring manner, which is conducive to balancing an overall impedance of the first signal lines 11 and the first fan-out lines 31 connected thereto, balancing an overall impedance of the second signal lines 12 and the second fan-out lines 32 connected thereto, and ensuring a signal transmission of the first signal lines 11 and the second signal lines 12.

Referring to FIGS. 1, 2 and 6, in an optional embodiment, the fan-out area A2 includes a first fan-out area A21 and a second fan-out area A22. Along the first direction D1, the second fan-out area A22 is on a side of the first fan-out area A21 away from the display area A0, that is, the second fan-out area A22 is between the first fan-out area A21 and the bonding area A3.

A same fan-out line 30 includes an electrically connected first sub-fan-out line 41 and a second sub-fan-out line 42. First sub-fan-out lines 41 are in the first fan-out area A21 and are distributed in the first metal layer M1 and the second metal layer M2. Second sub-fan-out lines 42 are in the second fan-out area A22 and is in the first metal layer M1 or the second metal layer M2.

Specifically, in the embodiment, the fan-out lines 30 are arranged in the first metal layer M1 and the second metal layer M2. Each fan-out line 30 includes a first sub-fan-out line 41 in the first fan-out area A21 and a second sub-fan-out line 42 in the second fan-out area A22. Taking two adjacent fan-out lines 30 as an example, when a first sub-fan-out line 41 of one fan-out line 30 is in the first metal layer M1 and a second sub-fan-out line 42 is in the second metal layer M2, a first sub-fan-out line 41 of the other fan-out line 30 is in the second metal layer M2, and a second sub-fan-out line 42 of the other fan-out line 30 is in the first metal layer M1. That is, when a first sub-fan-out line 41 and a second sub-fan-out line 42 in a same fan-out line 30 are arranged in different layers, two adjacent first sub-fan-out lines 41 along the second direction D2 are arranged in different layers, and two adjacent second sub-fan-out lines 42 along the second direction D2 are arranged in different layers. Therefore, a difficult wiring process caused by arranging the fan-out lines 30 in a same metal layer is effectively avoided, which is conducive to reducing a difficulty of wiring, reducing spaces occupied by the first fan outlet lines 31 and the second fan outlet lines 32 along the second direction D2, realizing a narrow bezel design of the display panel, balancing an overall impedance of the first signal lines 11 and the first fan-out lines 31 connected thereto, and an overall impedance of the second signal lines 12 and the second fan-out lines 32 connected thereto, and ensuring a signal transmission efficiency of the first signal lines 11 and the second signal lines 12.

Referring to FIGS. 2 and 6, the first sub-fan-out lines 41 in the first fan-out area A21 are laid out using double-layer wiring. That is, part of line segments of a same first sub-fan-out line 41 is in the first metal layer M1, and the other part of line segments of the same first sub-fan-out line 41 is in the second metal layer M2. The second sub-fan-out lines 42 in the second fan-out area A22 are laid out using single-layer wiring, that is, the second sub-fan-out lines 42 are distributed in a same metal layer either evenly in the first metal layer M1, or evenly in the second metal layer M2. In one embodiment, the second fan-out area A22 is between the first fan-out area A21 and the bonding area A3. Optionally, a width of the second fan-out area A22 along the first direction D1 is smaller than a width of the first fan-out area A21 along the first direction D1. In the embodiment, a double-layer wiring is performed on the first sub-fan-out line 41 in the first fan-out area A21 to balance impedances of the first signal lines or the second signal lines and the fan-out line connected thereto. As a result, a single-layer wiring of the second sub-fan-out line 42 in the second fan-out area A22 with a smaller width is conducive to avoiding a high process difficulty when forming connection via holes in the smaller second fan-out area A22 using double-layer wiring and is conducive to simplifying a wiring difficulty in the second fan-out area A22. Optionally, in the second fan-out area A22, the second sub-fan-out lines 42 connected to the first signal lines 21 are in a same metal layer, and the second sub-fan-out lines 42 connected to the second signal lines 22 are in another metal layer, which is conducive to avoiding mutual interference between the second sub-fan-out lines 42 connected to the first signal lines 21 and the second sub-fan-out lines 42 connected to the second signal lines 22 during wiring, and is also conducive to simplifying a wiring difficulty of the second fan-out area A22.

In one optional embodiment, a first sub-fan-out line 41 includes a first end D01 connected to a second sub-fan-out line 42. At least part of the second sub-fan-out lines 42 connected to first ends D01 are electrically connected to the bonding pads P0 by winding.

Specifically, an end of a first sub-fan-out line 41 close to the bonding area A3 is a first end D01. The first end D01 is electrically connected to a second sub-fan-out line 42 and is electrically connected to a binding pad P0 through the second sub-fan-out line 42. Part of the second sub-fan-out lines 42 are electrically connected to the bonding pads P0 by winding, which means that the bonding pads P0 connected to the second sub-fan-out lines 42 are not directly below the second sub-fan-out lines 42 along the first direction D1, and the second sub-fan-out lines 42 need to change extension directions thereof and extend to positions of corresponding bonding pads P0, thereby realizing electrical connections between the second sub-fan-out lines 42 and the bonding pads P0, avoiding floating pads that are not connected to the fan-out lines 30 in an area where the first bonding pads P1 and the second bonding pads P2 are located, thereby helping to improving an effective utilization of the bonding pads P0 in the bonding area A3. When the bonding area A3 in the display panel is configured for binding with a control chip, the pads on the control chip have a one-to-one correspondence with the bonding pads on the display panel. When a utilization rate of the bonding pads P0 on the display panel increases, a utilization rate of the pads on the control chip may also be improved, reducing unnecessary floating pads, which is conducive to reducing a production cost of the control chip bound to the bonding area A3.

In addition, if one end where a first sub-fan-out line 41 is connected to a second sub-fan-out line 42 is the first end D01, the other end of the first sub-fan-out line 41 is a second end D02. The first end D01 is closer to the bonding area A3 than the second end D02 and the second end D02 is closer to the display area A0 than the first end D01. In the first fan-out area A21, a trace spacing is large at an end close to the display area A0, and a trace spacing is small at an end close to the bonding area A3. A space occupied by the second fan-out area A22 along the second direction D2 is smaller than a space occupied by the first fan-out area A21 along the second direction D2. The second sub-fan-out lines 42 in the second fan-out area A22 are electrically connected to the bonding pads P0 by winding, which is conducive to appropriately reducing a cross-line distance, reducing a wiring difficulty, and is conducive to reducing a signal loss caused by long-distance signal transmission.

Referring to FIGS. 1, 2 and 6, in one optional embodiment, a second sub-fan-out line 42 includes a first sub-line 421 and a second sub-line 422, the first sub-line 421 is a line segment in the first fan-out line 31, and the second sub-line 422 is a line segment in the second fan-out line 32. First sub-lines 421 are in the first metal layer M1, and second sub-lines 422 are in the second metal layer M2, or the first sub-lines 421 are in the second metal layer M2, and the first sub-lines 421 are in the first metal layer M1. Orthographic projections of at least part of the first sub-lines 421 intersect orthographic projections of at least part of the second sub-lines 422 on a plane where the substrate is located.

Specifically, the second sub-fan-out lines 42 refers to line segments of the fan-out lines 30 in the second fan-out area A22. A second sub-fan-out line 42 includes a first sub-line 421 and a second sub-line 422 arranged in different layers, one of the first sub-line 421 and the second sub-line 422 is in the first metal layer M1, the other of the first sub-line 421 and the second sub-line 422 is in the second metal layer M2, and the first sub-line 421 and the second sub-line 422 are insulated from each other. The first sub-line 421 belongs to the first fan-out line 31 and the second sub-line 422 belongs to the second fan-out line 32. At least part of first sub-lines 421 and second sub-lines 422 in the second fan-out area A22 are arranged to overlap along a thickness direction of the display panel, which is conducive to reducing a space occupied by the first sub-lines 421 and the second sub-lines 422 in the second fan-out area A22 along the second direction D2, thereby providing a space for reducing a frame size of the display panel and helping to realize a narrow frame design of the display panel. In addition, the first sub-lines 421 and the second sub-lines 422 are arranged in different layers and overlap, which makes winding more convenient and reduces an existence of unnecessary floating pads.

Figure 8:
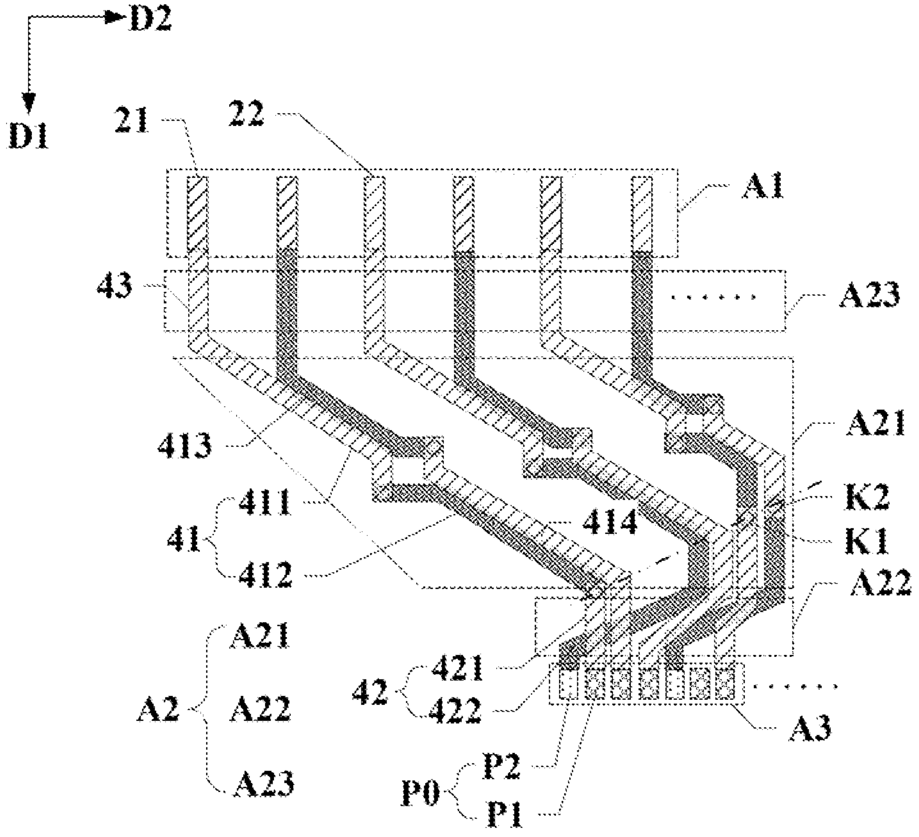
FIG. 8 illustrates another wiring diagram of a first wiring area, a fan-out area and a bonding area.
Figure 9:
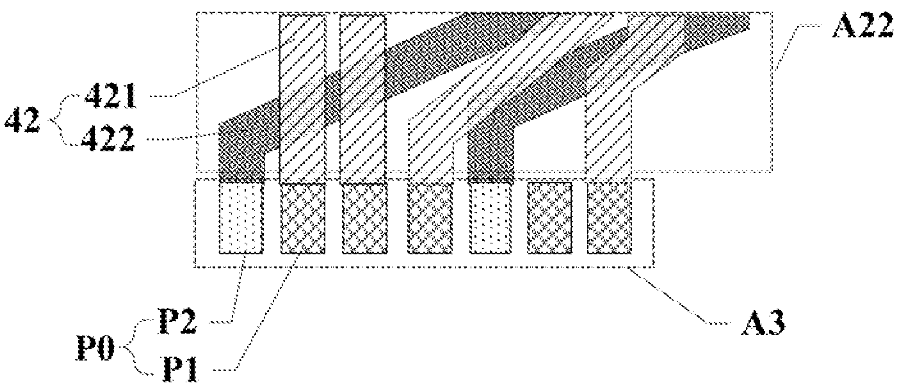
FIG. 9 illustrates an enlarged diagram of a second fan-out area and a bonding area in FIG. 8.

FIG. 8 illustrates another wiring diagram of the first wiring area A1, the fan-out area A2 and the bonding area A3. FIG. 9 illustrates an enlarged diagram of the second fan-out area and the bonding area in FIG. 8. Referring to FIGS. 1, 8 and 9, in one optional embodiment, at least part of the first sub-lines 421 and part of the first sub-fan-out line 41 are arranged in different layers and connected through first via holes K1 and at least part of the second sub-line 422 and the first sub-fan-out line 41 are arranged in different layers and connected through second via holes K2. The fan-out area A2 includes a first side fan-out area A201 and a second side fan-out area A202 arranged along the second direction D2. In the first side fan-out area A201 or the second side fan-out area A202, a connection line between a first via hole K1 and a second via hole K2 is on a same straight line. FIG. 8 illustrates a corresponding partial wiring situation in the first side fan-out area A201. Wiring in the second side fan-out area A202 is regarded as being symmetrical to wiring in the first side fan-out area A201. It should be noted that the embodiment of FIG. 1 only illustrates that when the fan-out area A2 is divided into two symmetrical fan-out areas along the second direction D2, the first side fan-out area A201 corresponds to the left fan-out area, and the second side fan-out area A202 corresponds to the right fan-out area. However, the first side fan-out area A201 and the second side fan-out area A202 are not limited herein. In some other embodiments, the first side fan-out area A201 can also be embodied as part of the left fan-out area, and the second side fan-out area A202 can also be embodied as part of the right fan-out area and be symmetrically arranged with the first side fan-out area A201. For example, the left fan-out area can be further divided into two parts along the second direction D2, and the right fan-out area can be divided into two parts along the second direction D2, so that two fan-out areas in a middle of the fan-out area A2 along the second direction D2 can be respectively embodied as the first side fan-out area and the second side fan-out area in one embodiment. Alternatively, two fan-out areas at an edge of the fan-out area A2 along the second direction D2 are respectively embodied as the first side fan-out area and the second side fan-out area in one embodiment. Optionally, when the two fan-out areas at the edge in the second direction D2 are respectively embodied as the first side fan-out area and the second side fan-out area in one embodiment, the first via holes and the second via holes in the first side fan-out area and the second side fan-out area may be arranged obliquely respectively. The first via holes and the second via holes in the two fan-out areas in the middle of the fan-out area A2 along the second direction D2 may be arranged along the second direction, which are not specifically limited herein.

Specifically, the first sub-lines 421 in the second fan-out area A22 are electrically connected to the first sub-fan-out lines 41 in the first fan-out area A21. When the first sub-lines 421 in the second fan-out area A22 and the first sub-fan-out lines 41 in the first fan-out area A21 are arranged in different layers, the first sub-lines 421 in the second fan-out area A22 and the first sub-fan-out lines 41 in the first fan-out area A21 need to be electrically connected through the first via holes K1. Similarly, the second sub-lines 422 in the second fan-out area A22 are electrically connected to the first sub-fan-out lines 41 in the first fan-out area A21. When the second sub-lines 422 in the second fan-out area A22 and the first sub-fan-out line 41 in the first fan-out area A21 are arranged in different layers, the second sub-lines 422 in the second fan-out area A22 and the first sub-fan-out line 41 in the first fan-out area A21 need to be electrically connected through the second via holes K2. In one embodiment, in a same side fan-out area A2, such as the first side fan-out area A201 or the second side fan-out area A202, and a connection line between a first via hole K1 and a second via hole K2 is on a same straight line. It should be noted that the straight line may be an arc structure that is approximately a straight line or may be a straight line structure in a strict sense, and the straight line may be inclined or horizontal. Arranging the first via holes K1 and the second via holes K2 obliquely is conducive to avoiding connections between the via holes that may be caused when the first via holes K1 and the second via holes K2 are too close to the bonding area A3, which may result in a signal crosstalk. In addition, an oblique arrangement of the first via holes K1 and the second via holes K2 does not require a high frame width of the display panel, thereby not requiring an additional frame area, which is conducive to realizing a narrow frame design of the display panel.

Referring to FIGS. 1, 2 and 8, in one optional embodiment, the fan-out area A2 also includes a third fan-out area A23 between the first fan-out area A21 and the display area A0. The third fan-out area A23 includes third sub-fan-out lines 43 electrically connected to the first sub-fan-out lines 41. Along a direction perpendicular to the plane where the display panel is located, the third sub-fan-out lines 43 do not overlap with each other.

Referring to FIGS. 1, 2 and 8, the third fan-out area A23 is between the first fan-out area A21 and the display area A0. The third sub-fan-out lines 43 are arranged in the third fan-out area A23. The third sub-fan-out lines 43 are configured to connect the first signal lines 11 in the display area A0 to the first sub-fan-out lines 41 in the first fan-out area A21, as well as to connect the second signal lines 12 in the display area A0 to the first sub-fan-out lines 41 in the first fan-out area A21. In the third fan-out area A23, orthographic projections of all the third sub-fan-out lines 43 on the plane where the display panel is located do not overlap, which is conducive to reducing coupling between the third sub-fan-out lines 43 and improving signal stability on the first signal lines 11 and the second signal lines 12 connected to the third sub-fan-out lines 43.

Optionally, the third sub-fan-out lines 43 can be distributed in two metal layers, that is, arranged in different layers. Optionally, all the third sub-fan-out lines 43 can also be arranged in a same layer, that is, the third sub-fan-out lines 43 are laid out in a single-layer wiring manner, which is conducive to simplifying a wiring process of the third sub-fan-out lines 43. Optionally, all the third sub-fan-out lines 43 extend along the first direction D1, which is conducive to further reducing a wiring process of the third sub-fan-out lines 43.

Figure 10:
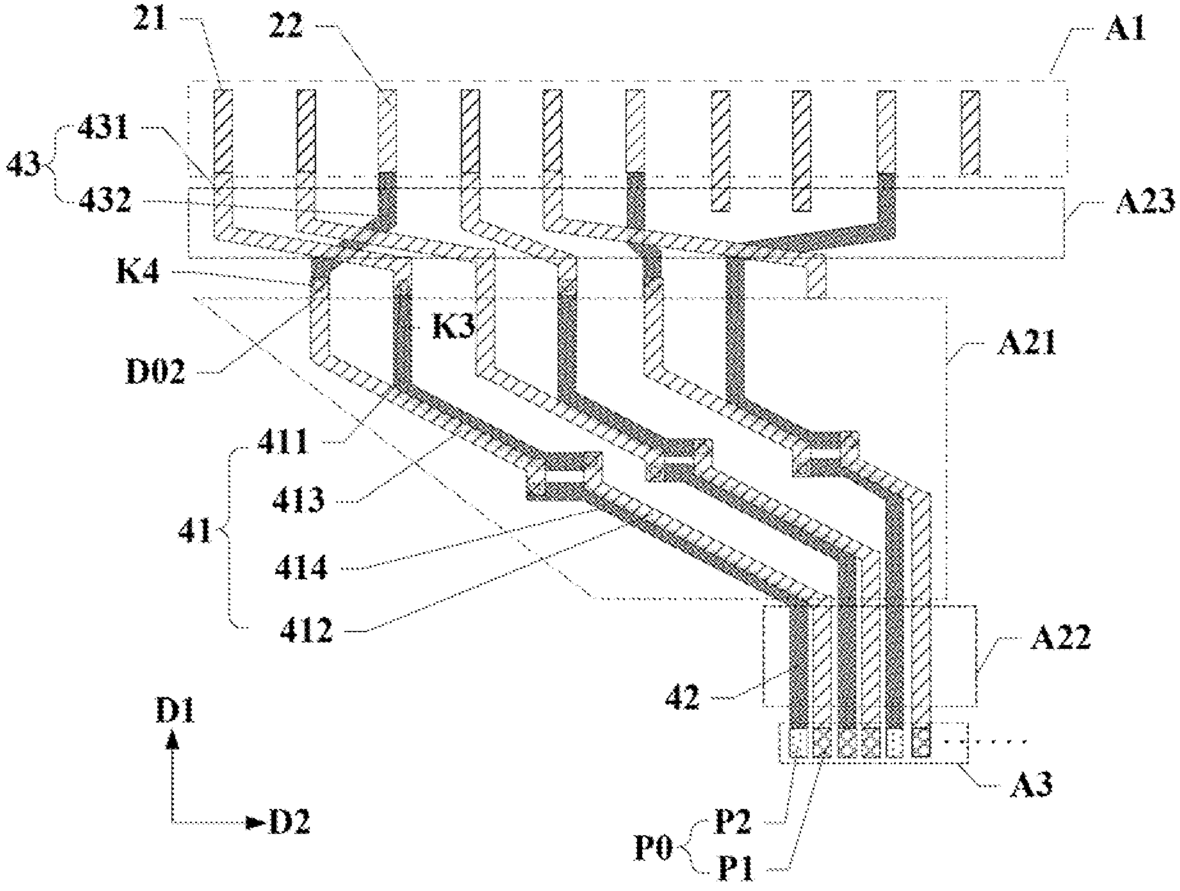
FIG. 10 illustrates another wiring diagram of a first wiring area, a fan-out area and a bonding area.

FIG. 10 illustrates another wiring diagram of the first wiring area A1, the fan-out area A2 and the bonding area A3. One embodiment shown in FIG. 10 illustrates another wiring method in the fan-out area A2.

Referring to FIG. 10, in one optional embodiment, the fan-out area A2 also includes a third fan-out area A23 between the first fan-out area A21 and the display area A0. The third fan-out area A23 includes third sub-fan-out lines 43 electrically connected to the first sub-fan-out lines 41. The first sub-fan-out lines 41 include second ends D02 connected to the third sub-fan-out lines 43. At least part of the third sub-fan-out lines 43 connected to the second ends D02 are electrically connected to the first sub-fan-out lines 41 by winding. The second sub-fan-out lines 42 extend along the first direction D1 and are electrically connected to the bonding pads P0.

The embodiment illustrates another wiring method of the fan-out lines 30 in the fan-out area A2. Specifically, the third sub-fan-out lines 43 in the third fan-out area A23 are connected to the first sub-fan-out lines 41 in the first fan-out area A21 using crossline connections. In the first sub-fan-out lines 41 in the first fan-out area A21, ends of the first sub-fan-out line 41 connected to the third sub-fan-out lines 43 in the third fan-out area A23 are second ends D02. When the third sub-fan-out lines 43 are electrically connected to the second ends D02 of the first sub-fan-out line 41 by winding. The second ends D02 of the first sub-fan-out line 41 corresponding to the third sub-fan-out lines 43 are not directly below ends of the third sub-fan-out lines 43 facing the first fan-out lines 31 along the first direction D1. The third sub-fan-out lines 43 need to change extension direction thereof and extend to positions of the second ends D02 of the corresponding first sub-fan-out lines 41, thereby realizing electrical connections between the third sub-fan-out lines 43 and corresponding first sub-fan-out lines. When the third sub-fan-out lines 43 are wound, the second sub-fan-out lines 42 in the second fan-out area A22 do not need to be wound again, which is conducive to simplifying connection difficulties between the second sub-fan-out lines 42 and the bonding pads P0. In addition, since the third fan-out area A23 is closest to the display area A0, wiring widths of the fan-out lines 30 along the second direction D2 tend to decrease from the third fan-out area A23 towards the second fan-out area A2. That is, wiring spacings of the third fan-out area A23 are relatively large. When the third sub-fan-out lines 43 and the first sub-fan-out lines 41 need to be electrically connected through connecting holes, distances between the connecting holes will also be relatively large, which is conducive to avoiding mutual signal interference between the connection holes, reducing a forming difficulty, and simplifying a forming process.

Referring to FIG. 10 and FIG. 6, in one optional embodiment, a third sub-fan-out line 43 includes a third sub-line 431 and a fourth sub-line 432. The third sub-line 431 is a line segment in a first fan-out line 31, and the fourth sub-line 432 is a line segment in a second fan-out line 32. Third sub-lines 431 are in the first metal layer M1, and fourth sub-lines 432 are in the second metal layer M2, or the third sub-lines 431 are in the second metal layer M2, and the fourth sub-lines 432 are in the first metal layer M1. Orthographic projections of at least part of the third sub-lines 431 intersect orthographic projections of at least part of the fourth sub-lines 432 on the plane where the substrate is located.

Specifically, the embodiment shown in FIG. 10 distinguishes the third sub-lines 431 from the fourth sub-lines 432 in the third sub-fan-out lines 43 using different fillings. In the third fan-out area A23, one of the third sub-lines 431 and the fourth sub-lines 432 is in the first metal layer M1, and the other is in the second metal layer M2. Therefore, when the third sub-lines 431 need to be wound, the fourth sub-lines 432 will not affect a winding process of the third sub-lines 431. Similarly, when the fourth sub-lines 432 needs to be wound, the third sub-lines 431 will not affect a winding process of the fourth sub-lines 432, thereby effectively reducing a wiring difficulty for both the third sub-lines 431 and the fourth sub-lines 432 during winding, which is conducive to simplifying a wiring difficulty in the third fan-out area A23 of the display panel.

Referring to FIG. 10, in one optional embodiment, at least part of the third sub-lines 431 and the first sub-fan-out lines 41 are arranged in different layers and connected through third via holes K3. At least part of the fourth sub-lines 432 and the first sub-fan-out lines 41 are arranged in different layers and connected through fourth via holes K4. The fan-out area A2 includes a first-side fan-out area A201 and a second-side fan-out area A202 arranged along the second direction D2. In the first-side fan-out area A201 or the second-side fan-out area A202, a connection line between a third via hole K3 and a fourth via hole K4 is on a same straight line.

Specifically, the third sub-lines 431 in the third fan-out area A23 are electrically connected to the first sub-fan-out lines 41 in the first fan-out area A21. When the third sub-lines 431 and the first sub-fan-out lines 41 are arranged in different layers, the third sub-lines 431 need to be electrically connected to the first sub-fan-out lines 41 through the third via holes K3. Similarly, the fourth sub-lines 432 in the third fan-out area A23 are electrically connected to the first sub-fan-out lines 41 in the first fan-out area A21. When the fourth sub-lines 432 and the first sub-fan-out lines 41 are arranged in different layers, the fourth sub-lines 432 need to be electrically connected to the first sub-fan-out lines 41 through the fourth via holes K4. In the embodiment, in a same side fan-out area, such as the first side fan-out area A201 or the second side fan-out area A202 shown in FIG. 1, a connection line between a third via hole K3 and a fourth via hole K4 is on a same straight line. It should be noted that the straight line can be an arc structure that is approximately a straight line or a straight-line structure in a strict sense. The straight line can be inclined or horizontal. In the embodiment, an approximate straight line connecting the third via K3 and the fourth via K4 is taken as an example for illustration. wiring spaces of the fan-out lines 30 tend to decrease along the second direction D2 from the third fan-out area A23 towards the second fan-out area A22. The third via holes K3 and the fourth via holes K4 are in a relatively large area where the third fan-out area A23 meets the first fan-out area A21. A spacing between adjacent lines is also relatively large, which is conducive to increasing a spacing between adjacent via holes and reducing signal crosstalk between the adjacent via holes. In addition, connection lines between the third via holes K3 and the fourth via holes K4 are arranged as linear structures extending along the second direction D2, which is also conducive to reducing layout spacings of the third via holes K3 and the fourth via holes K4 along the first direction D1 and realizing a narrow frame design of the display panel.

Referring to FIG. 10, in one optional embodiment, in the second fan-out area A22, along the direction perpendicular to the plane where the display panel is located, the second sub-fan-out lines 42 do not overlap with each other.

To realize corresponding connections between the second sub-fan-out lines 42 in the second fan-out area A22 and the bonding pads P0 of the bonding area A3, and to avoid an occurrence of floating pads between adjacent first bonding pads P1, between adjacent second bonding pads P2, and between adjacent first bonding pads P1 and second bonding pads P2, in one embodiment, the third sub-fan-out lines 43 are wound and arranged in the third fan-out area A23, which is equivalent to setting an arrangement order of the second sub-fan-out lines 42 in the second fan-out area A22 to be same as an arrangement order of the corresponding bonding pads P0 by winding the third sub-fan-out lines 43. That is, the bonding pads P0 connected to the second sub-fan-out lines 42 are directly below the second sub-fan-out lines 42 along the first direction D1. Therefore, the second sub-fan-out lines 42 can be electrically connected to the corresponding bonding pads P0 without winding, which effectively simplifies a difficulty of connecting the second sub-fan-out lines 42 to the bonding pads P0. Optionally, all the second sub-fan-out lines 42 are arranged in a same layer, and all the second sub-fan-out lines 42 extend along the first direction D1, which is conducive to simplifying a wiring difficulty of the second sub-fan-out lines 42 and improving a production efficiency of the display panel.

Referring to FIG. 2, in one optional embodiment, in the first fan-out area A21, along the direction perpendicular to the plane where the display panel is located, the first sub-fan-out lines 41 do not overlap with each other.

When part of line segments of the first sub-fan-out lines 41 in the first fan-out area A21 are arranged in the first metal layer M1 and another part of the line segments of the first sub-fan-out lines 41 in the first fan-out area A21 are arranged in the second metal layer M2, optionally, corresponding line segments of any two adjacent first sub-fan-out lines 41 along the second direction D2 are in different film layers. Orthographic projections of different first sub-fan-out lines 41 on the plane of the display panel do not overlap, which is conducive to reducing signal couplings caused by overlaps of different first sub-fan-out lines 41 and improving an accuracy and stability of signals transmitted by the first signal lines 11 and the second signal lines 12.

Referring to FIG. 8 and FIG. 10, in one optional embodiment, in the first fan-out area A21, a first sub-fan-out line of part of the first sub-fan-out lines 41 include a first line segment 411 and a second line segment 412 that are connected to each other and arranged in different layers. The first line segment 411 is between the second line segment 412 and a first lead 21. A first sub-fan-out line of part of the first sub-fan-out lines 41 includes a third line segment 413 and a fourth line segment 414 that are connected to each other and arranged in different layers. The third line segment 413 is between the fourth line segment 414 and a second lead 22. First line segments 411 and third line segments 413 are arranged in different layers, and second line segments 412 and fourth line segments 414 are arranged in different layers. Along the direction perpendicular to the plane of the display panel, the first line segments 411 overlap the third line segments 413, and/or the second line segments 412 overlap the fourth line segments 414.

Figure 11:
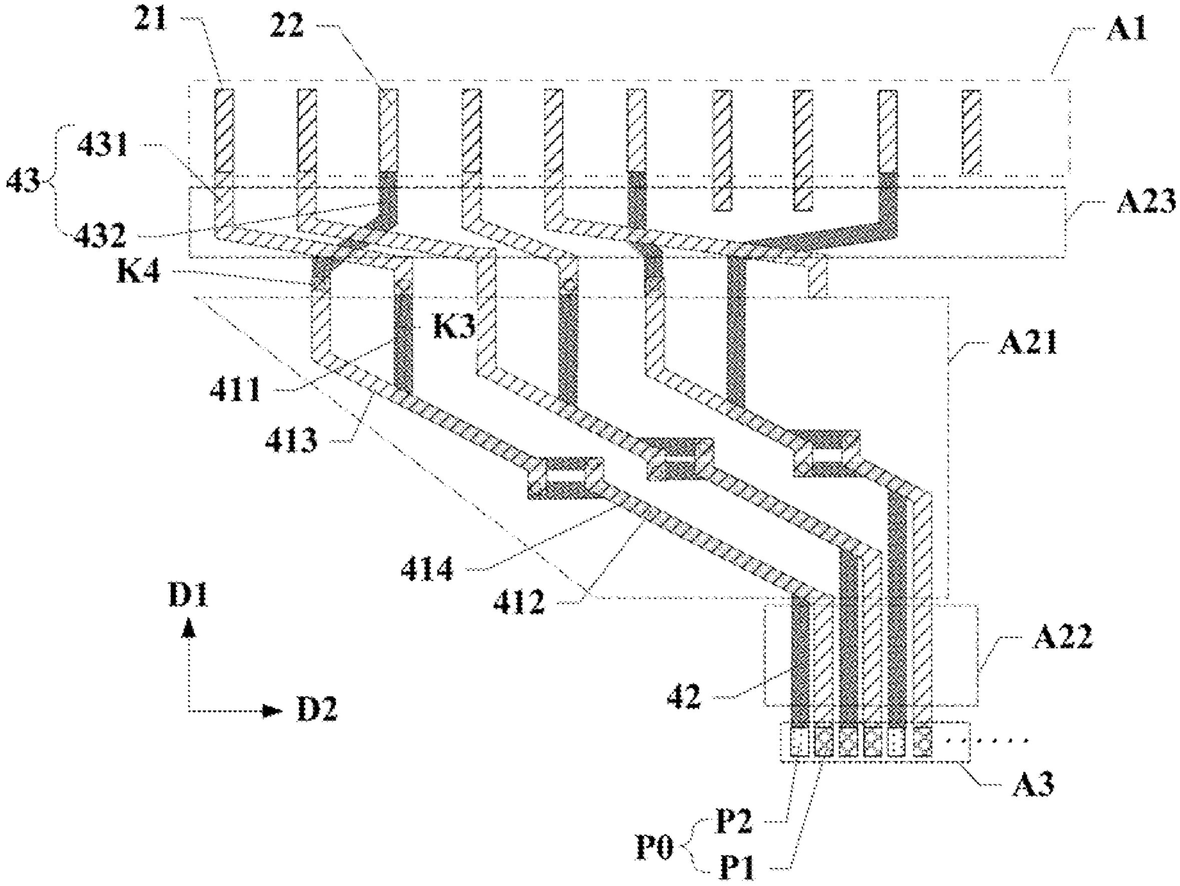
FIG. 11 illustrates another wiring diagram of a first wiring area, a fan-out area and a bonding area.
Figure 12:
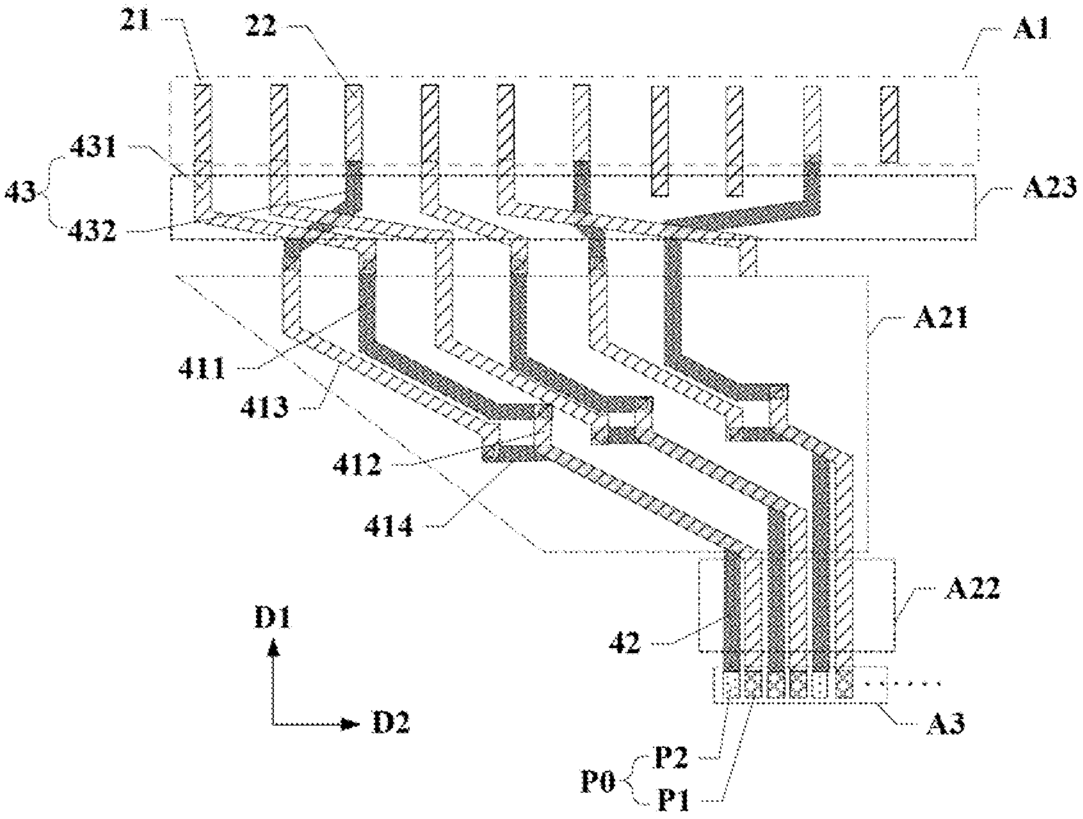
FIG. 12 illustrates another wiring diagram of a first wiring area, a fan-out area and a bonding area.
Figure 13:
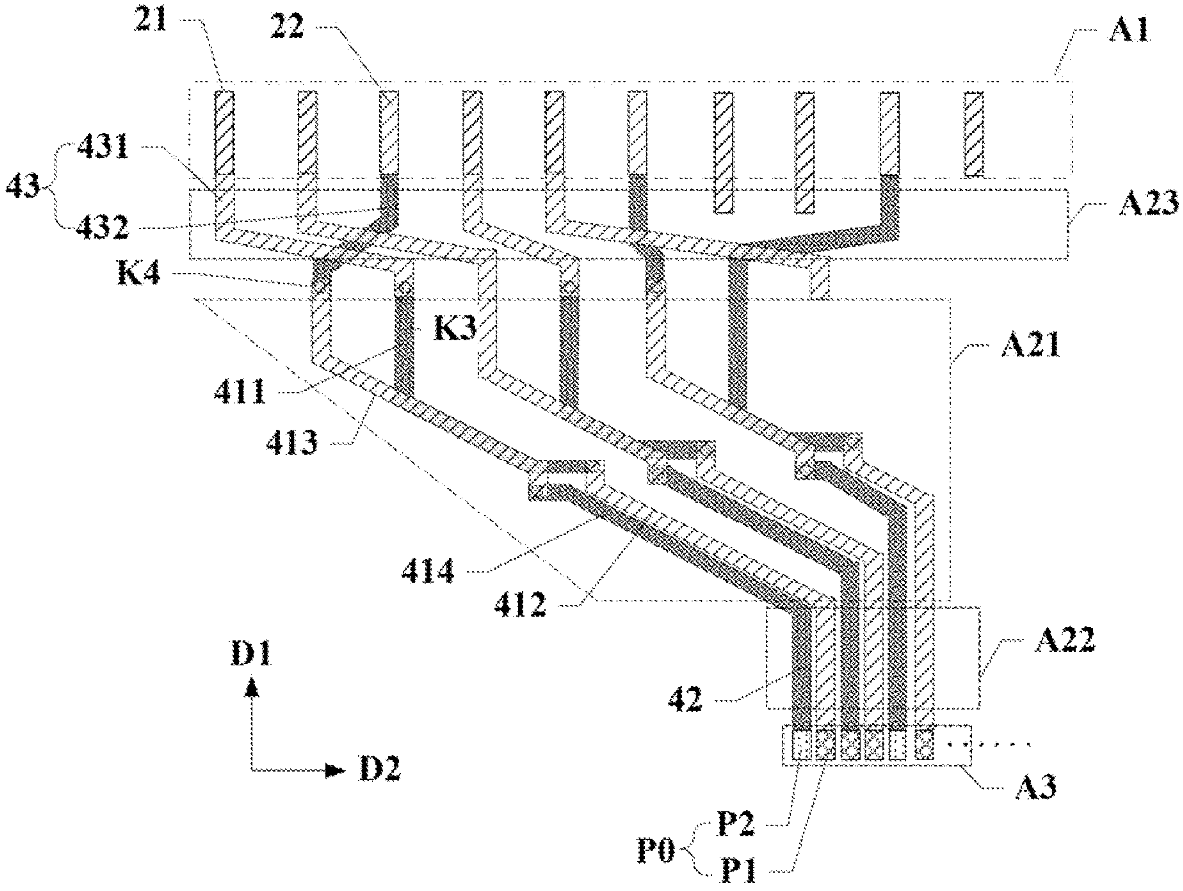
FIG. 13 illustrates another wiring diagram of a first wiring area, a fan-out area and a bonding area.

Specifically, the first line segments 411 and the second line segments 412 in part of the first sub-fan-out lines 41 are arranged in different layers, and the third line segments 413 and the fourth line segments 414 in part of the first sub-fan-out lines 41 are arranged in different layers. Both the first line segments 411 and the third line segments 413 are arranged near the display area A0, and both the second line segment 412 and the fourth line segment 414 are arranged near the second fan-out area A22. Orthographic projections of the first line segments 411 overlap orthographic projections of the third line segments 413 on the plane where the display panel is located, and orthographic projections of the second line segments 412 overlap orthographic projections of the fourth line segments 414 on the plane where the display panel is located. It should be noted that FIG. 8 and FIG. 10 only illustrates that the orthographic projections of the first line segments 411 partially overlap the orthographic projections of the third line segments 413 on the plane where the display panel is located, and the orthographic projections of the second line segments 412 partially overlap orthographic projections of the fourth line segments 414 on the plane where the display panel is located. In other embodiments, overlapping areas of the orthographic projections of the first line segments 411 and the third line segments 413 on the plane where the display panel is located, and overlapping areas of the orthographic projections of the second line segments 412 and the fourth line segments 414 on the plane where the display panel is located can be arranged according to an actual situation, which is not specifically limited herein. FIGS. 11 to 13 respectively illustrate other wiring diagrams of the first wiring area A1, the fan-out area A2 and the bonding area A3. FIG. 11 illustrates that orthographic projections of part of the first line segments 411 completely overlap orthographic projections of part of the third line segments 413 on the plane where the display panel is located, and orthographic projections of part of the second line segments 412 completely overlap orthographic projections of part of the fourth line segments 414 on the plane where the display panel is located, which is equivalent to increasing overlapping areas. FIG. 12 illustrates that the orthographic projections of the first line segments 411 do not overlap the orthographic projections of the third line segments 413 on the plane where the display panel is located, and the orthographic projections of the second line segments 412 overlap the orthographic projections of the fourth line segments 414 on the plane where the display panel is located. FIG. 13 illustrates that the orthographic projections of the first line segments 411 overlap the orthographic projections of the third line segments 413 on the plane where the display panel is located, and the orthographic projections of the second line segments 412 do not overlap the orthographic projections of the fourth line segments 414 on the plane where the display panel is located.

Referring to FIGS. 8, 10, 11 and 13, when the orthographic projections of the first line segments 411 overlap the orthographic projections of the third line segments 413 on the plane where the display panel is located, assuming that the overlapping first line segments 411 and the third line segments 413 form first signal line groups, it is conducive to decreasing spaces occupied by the first line segments 411 and the third line segments 413 in the first signal line groups along the second direction D2, reducing spacings between adjacent first signal line groups along the second direction D2 and spaces occupied by the first signal line groups along the first direction D1 to create room for a lower frame of the display panel and realizing a narrow bottom frame design of the display panel.

Referring to FIGS. 8, 10, 11 and 12, when the orthographic projections of the second line segment 412 overlap the orthographic projections of the fourth line segment 414 on the plane where the display panel is located, assuming that the overlapping the second line segments 412 and the fourth line segments 414 form second signal line groups, it is conducive to decreasing spaces occupied by the second line segments 412 and the fourth line segments 414 in second signal line groups along the second direction D2, reducing spacings between adjacent second signal line groups along the second direction D2, and spaces occupied by the second signal line groups along the first direction D1 to create room for a lower frame of the display panel and realizing a narrow bottom frame design of the display panel. In addition, considering that the second line segments 412 and the fourth line segments 414 are closer to the bonding area A3 than the corresponding first line segments 411 and the second line segments 412, and from the first fan-out area A21 to the bonding area A3, widths of the fan-out area along the second direction decreasing, that is, a space in an area where the second line segments 412 and the fourth line segments 414 are located is relatively small. When the orthographic projections of the second line segments 412 are arranged to overlap the orthographic projections of the fourth line segments 414 on the plane where the display panel is located, a space of the fan-out area can be more rationally utilized.

It should be noted that in the first fan-out area, when orthographic projections of first sub-fan-out lines respectively corresponding to two signal lines in the display area overlap on the display panel, optionally, the two signal lines corresponding to the two overlapping first sub-fan-out lines are charged at a same time. If the two signal lines are data lines, the two overlapping first sub-fan-out lines transmit data signals at a same time, which is conducive to avoiding a problem that when one of the two overlapping first sub-fan-out lines transmits a data signal and the other of the two overlapping first sub-fan-out lines does not transmit a data signal, the first sub-fan-out line through which the data signal flows causes signal coupling to the other first sub-fan-out line.

Figure 14:
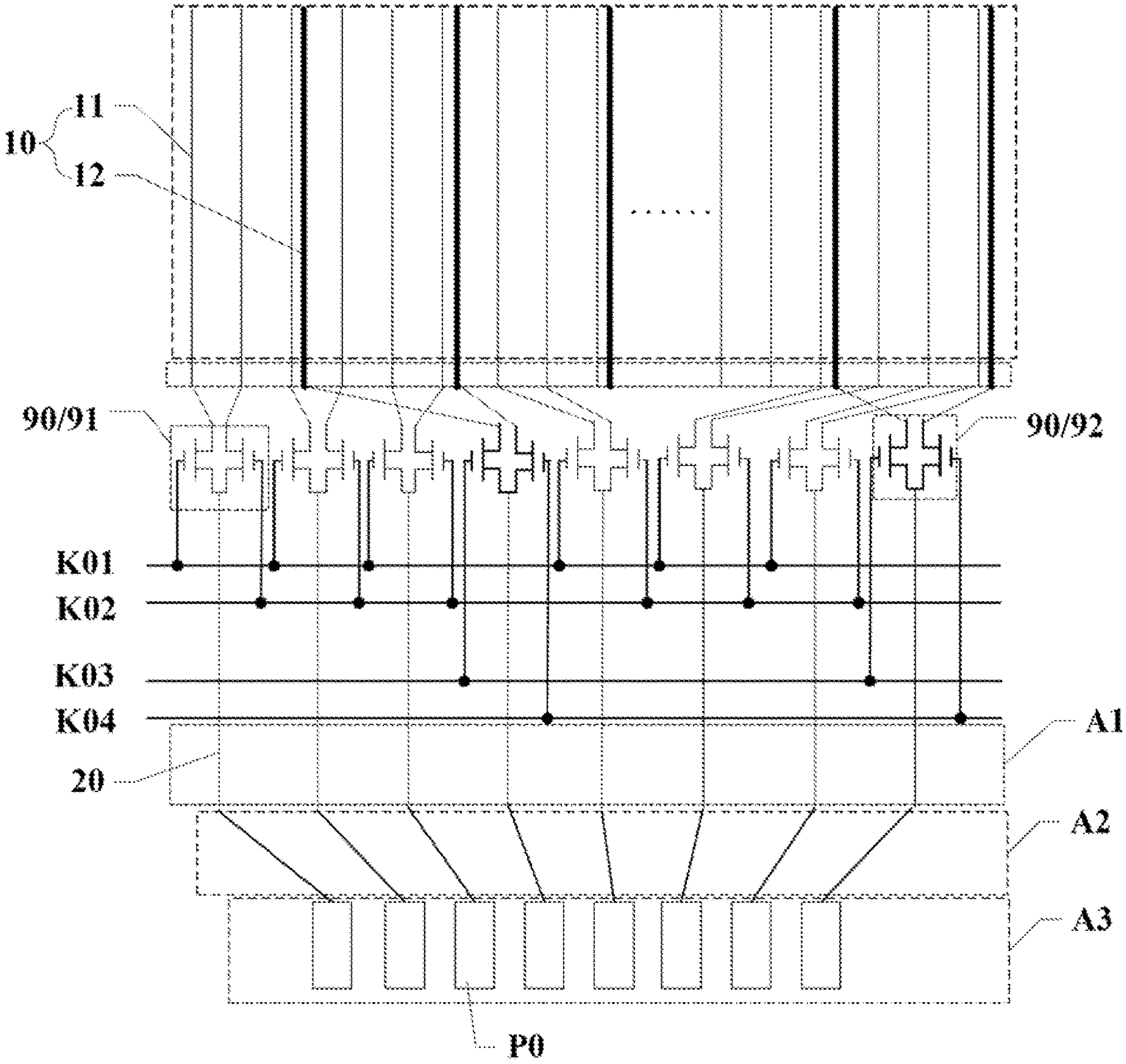
FIG. 14 illustrates a schematic diagram of connections between signal lines and signal leads through multiplexing units.

FIG. 14 illustrates a schematic diagram of connections between signal lines 10 and signal leads 20 through multiplexing units 90. Referring to FIG. 1, in one optional embodiment, the signal leads 20 in the first wiring area A1 are electrically connected to the signal lines 10 in the display area A0 in a one-to-one correspondence. Alternatively, referring to FIG. 14, The display panel also includes multiplexing units 90 between the first wiring area A1 and the display area A0. The signal leads 20 are electrically connected to the signal lines 10 through the multiplexing units 90.

Specifically, the embodiment of FIG. 1 illustrates that the signal lines 10 in the display area A0 are directly electrically connected to the signal leads 20 in the first wiring area A1. That is, no other connectors are arranged between the signal lines 10 and the signal leads 20 in the first wiring area A1. Ends of the signal lines 10 facing the first wiring area A1 are directly electrically connected to ends of the signal leads 20 facing the display area A0.

One embodiment of FIG. 14 introduces multiplexing units 90 between the display area A0 and the first wiring area A1. Specifically, first ends of the multiplexing units 90 are electrically connected to the fanout lines 30 and are connected to the bonding pads P0 through the fanout lines 30. A same multiplexing unit 90 includes at least two second ends (the embodiment is described by taking two second ends as an example, while in some other embodiments, a same multiplexing unit 90 includes three or more second ends). The two second ends are electrically connected to two signal lines 10 respectively. That is, the two signal lines 10 are electrically connected to a same bonding pad P0 through a multiplexing unit 90. In the embodiment, multiplexing units corresponding to the first signal lines 11 are first multiplexing units 91 with control ends of two transistors in each first multiplexing unit 91 electrically connected to control signal lines K01 and K02 respectively, multiplex control units corresponding to the second signal lines 12 are second multiplexing units 92 with control ends of two transistors in each second multiplexing unit 92 electrically connected to control signal lines K03 and K04 respectively, thereby achieving separate controls of the first signal lines 11 and the second signal lines 12. Optionally, a same multiplexing unit 90 includes a same number of switching transistors as the second ends. Two switching transistors are turned on in a time-sharing manner, so that the bonding pads P0 are turned on in a time-sharing manner with the signal lines 10 connected to a same multiplexing unit 90. Introducing the multiplexing units 90 effectively reduce number of bonding pads P0 corresponding to the signal lines 10, which is conducive to saving a forming cost of the control chip bound to the bonding pads P0. It should be noted that wiring of the fan-out area A2 in FIG. 14 is only for illustration, and specific wiring methods can refer to the above embodiments, which are not repeated herein.

Figure 15:
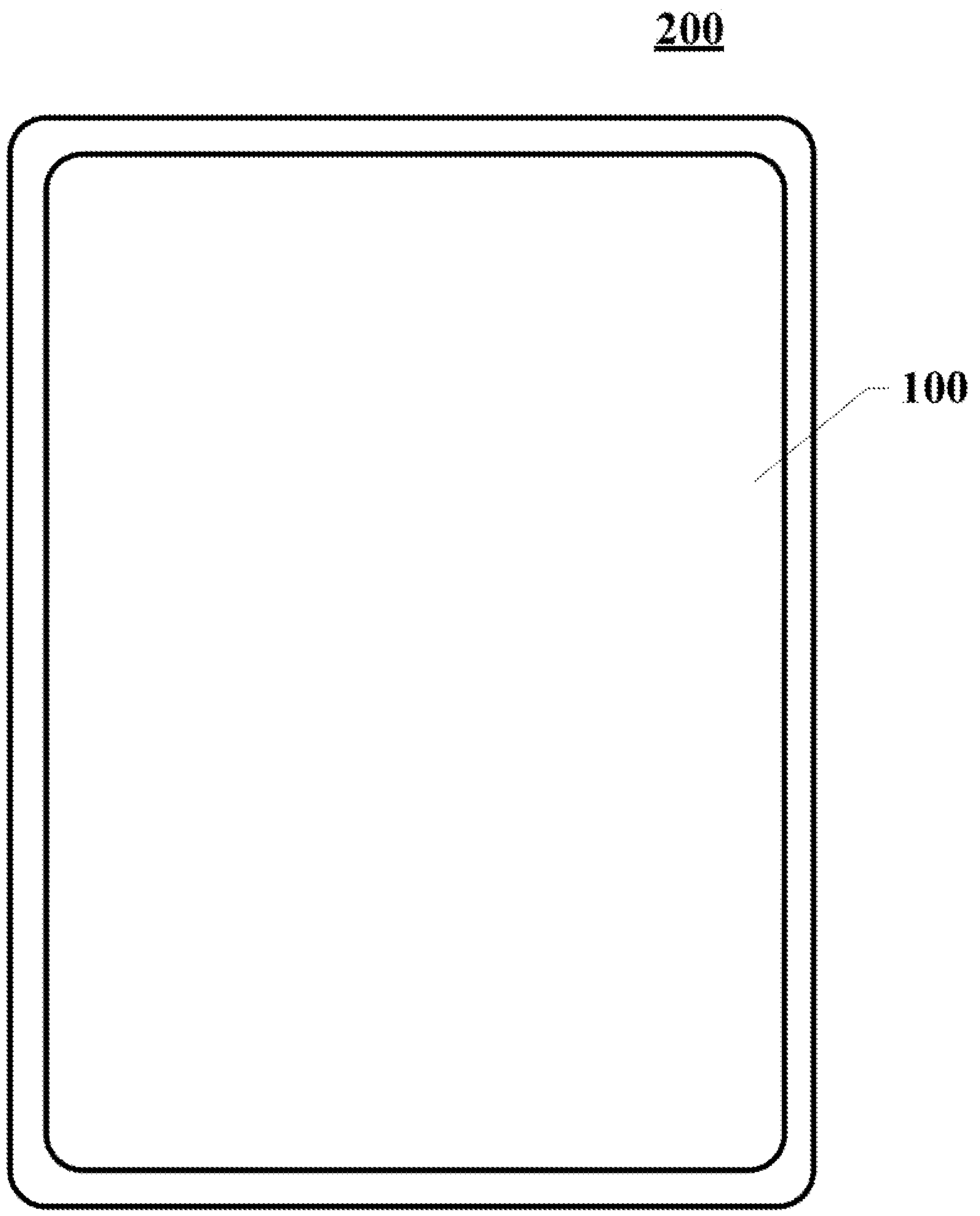
FIG. 15 illustrates a top view of a display device consistent with various embodiments of the present disclosure.

Based on a same inventive concept, the present disclosure also provides a display device. FIG. 15 illustrates a top view of a display device consistent with various embodiments of the present disclosure. A display device 200 includes the display panel 100 in any of the above embodiments.

The display device 200 may be any electronic device with a display function, such as a touch screen, a mobile phone, a tablet computer, a notebook computer, an electronic paper book, or a television. The display device 200 has beneficial effects of the display panel 100 provided by the embodiments of the present disclosure. Details can be referred to specific descriptions of the display panel 100 in the above embodiments, which are not repeated herein.

It can be understood that in FIG. 15, the display device 200 is illustrated in a rounded rectangular structure for illustrative purposes. In some other embodiments, the display device 200 may also be embodied in a rectangular, circular, oval or any other feasible shape, which is not specifically limited herein.

As disclosed, the display panel, and display device provided by the present disclosure at least realize the following beneficial effects.

In the display panel and display device provided by the present disclosure, a first wiring area, a fan-out area and a bonding area are arranged on a side of a display area. First signal lines in a display area are electrically connected to first leads in the first wiring area. The first leads are electrically connected to first bonding pads in the bonding area through first fan-out lines in the fan-out area. Second signal lines in the display area are electrically connected to second leads in the first wiring area, and the second leads are electrically connected to second bonding pads in the bonding area through second fan-out lines in the fan-out area, thereby realizing electrical connections between the first signal lines in the display area and the first bonding pads in the bonding area and electrical connections between the second signal lines in the display area and the second bonding pads in the bonding area. In the present disclosure, at least part of line segments in the first fan-out lines and at least part of line segments in the second fan-out lines are arranged in a same layer. In a related art, if part of line segments of the first fan-out lines and part of line segments of the second fan-out lines are arranged in a same layer, when the first fan-out lines and the second fan-out lines are electrically connected to the bonding pads respectively, in order to avoid mutual interference between fan-out lines arranged in a same layer, there may be floating pads between the bonding pads connected to the first fan-out lines and the second fan-out lines, affecting an effective utilization of the pads. Therefore, in the present disclosure, no floating pads are arranged between adjacent first bonding pads, between adjacent second bonding pads, and between adjacent first bonding pads and second bonding pads along a second direction. That is, no pads that do not transmit valid signals are arranged, thereby effectively improving an effective utilization of the pads on the display panel and the control chip bound to the bonding area of the display panel.

Although some specific embodiments of the present disclosure have been illustrated in detail through examples, A person skilled in the art should understand that the above examples are for illustration only and are not intended to limit the scope of the present disclosure. A person skilled in the art should understand that the above embodiments may be modified without departing from the scope and spirit of the present disclosure which are to be defined by the appended claims.

What is claimed is:

1. A display panel, comprising a display area, a first wiring area, a fan-out area, and a bonding area on a side of the display area along a first direction, wherein:

the first wiring area is between the fan-out area and the display area, and the bonding area is on a side of the fan-out area away from the first wiring area;

the display area includes a plurality of signal lines extending along the first direction and arranged along a second direction, the plurality of signal lines includes M first signal lines and S second signal lines, the first direction intersects the second direction, the first wiring area includes a plurality of signal leads extending along the first direction and arranged along the second direction, the plurality of signal leads includes N first leads and P second leads, the first leads are electrically connected to the first signal lines, the second leads are electrically connected to the second signal lines, M, N, S and P are all integers greater than 1, and N≤M, P≤S;

the fan-out area includes a plurality of fan-out lines including N first fan-out lines and P second fan-out lines, the first fan-out lines are electrically connected to the first leads, the second fan-out lines are electrically connected to the second leads, and at least part of line segments in the first fan-out lines and at least part of line segments in the second fan-out lines are arranged in a same layer;

the display panel further includes a substrate, and a first metal layer and a second metal layer arranged on a same side of the substrate, in the fan-out area, the fan-out lines are distributed in the first metal layer and the second metal layer;

the fan-out area includes a first fan-out area and a second fan-out area, along the first direction, the second fan-out area is on a side of the first fan-out area away from the display area, a same fan-out line includes a first sub-fan-out line in the first fan-out area and a second sub-fan-out line in the second fan-out area that are electrically connected, the fan-out lines include first sub-fan-out lines and second sub-fan-out lines, the first sub-fan-out lines are distributed in the first metal layer and the second metal layer, and the second sub-fan-out lines are in the first metal layer or the second metal layer;

the second sub-fan-out line includes a first sub-line and a second sub-line, first sub-lines are in the first metal layer and second sub-lines are in the second metal layer, or the first sub-lines are in the second metal layer and the second sub-lines are in the first metal layer, and orthographic projections of at least part of the first sub-lines intersect orthographic projections of at least part of the second sub-lines on a plane where the substrate is located; and the bonding area includes a plurality of bonding pads arranged along the second direction, the plurality of bonding pads include N first bonding pads connected to the first fan-out lines and P second bonding pads connected to the second fan-out lines, along the second direction, no floating pads are arranged between adjacent first bonding pads, between adjacent second bonding pads and between adjacent first bonding pads and second bonding pads.

2. The display panel according to claim 1, wherein a first interval is between adjacent bonding pads arranged along the second direction, and a width of the first interval along the second direction is less than or equal to a width of a single bonding pad.

3. The display panel according to claim 1, wherein the first signal lines and the second signal lines are arranged in a same layer.

4. The display panel according to claim 1, wherein along the second direction, the second bonding pads are interspersed and arranged between the first bonding pads.

5. The display panel according to claim 1, wherein:

the first signal lines are data lines, and the second signal lines are touch signal lines; or the first signal lines are touch signal lines, and the second signal lines are data lines.

6. The display panel according to claim 1, wherein:

the first sub-fan-out line includes a first end connected to the second sub-fan-out line; and at least part of second sub-fan-out lines connected to first ends are electrically connected to the bonding pads by winding.

7. The display panel according to claim 6, wherein:

the first sub-line is a line segment in the first fan-out lines, and the second sub-line is a line segment in the second fan-out lines.

8. The display panel according to claim 7, wherein:

at least part of the first sub-lines and the first sub-fan-out lines are arranged in different layers and connected through first via holes, at least part of the second sub-lines and the first sub-fan-out lines are arranged in different layers and connected through second via holes; and the fan-out area includes a first side fan-out area and a second side fan-out area arranged along the second direction, in the first side fan-out area or the second side fan-out area, a line connecting a first via hole and a second via hole is on a same straight line.

9. The display panel according to claim 6, wherein the fan-out area also includes a third fan-out area between the first fan-out area and the display area, the third fan-out area includes third sub-fan-out lines electrically connected to the first sub-fan-out lines; and along a direction perpendicular to a plane where the display panel is located, the third sub-fan-out lines do not overlap with each other.

10. The display panel according to claim 1, wherein:

the fan-out area also includes a third fan-out area between the first fan-out area and the display area, the third fan-out area includes third sub-fan-out lines electrically connected to the first sub-fan-out lines; and the first sub-fan-out line includes a second end connected to a third sub-fan-out line, and at least part of the third sub-fan-out lines connected to second ends are connected to the first sub-fan-out lines by winding and the second sub-fan-out lines extend along the first direction and are electrically connected to the bonding pads.

11. The display panel according to claim 10, wherein:

the third sub-fan-out line includes a third sub-line and a fourth sub-line, the third sub-line is a line segment in the first fan-out line, and the fourth sub-line is a line segment in the second fan-out line, and the third sub-fan-out lines include third sub-lines and fourth sub-lines, the third sub-lines are in the first metal layer, and the fourth sub-lines are in the second metal layer, or the third sub-lines are in the second metal layer, and the fourth sub-lines are in the first metal layer, and orthographic projections of at least part of the third sub-lines intersect orthographic projections of at least part of the fourth sub-lines on the plane where the substrate is located.

12. The display panel according to claim 11, wherein:

at least part of the third sub-lines and the first sub-fan-out lines are arranged in different layers and connected through third via holes, at least part of the fourth sub-lines and the first sub-fan-out lines are arranged in different layers and connected through fourth via holes; and the fan-out area includes a first side fan-out area and a second side fan-out area arranged along the second direction, in the first side fan-out area or the second side fan-out area, a connection line between a third via hole and a fourth via hole is on a same straight line.

13. The display panel according to claim 10, wherein in the second fan-out area, all the second sub-fan-out lines do not overlap with each other in a direction perpendicular to a plane where the display panel is located.

14. The display panel according to claim 1, wherein in the first fan-out area, in a direction perpendicular to a plane where the display panel is located, all the first sub-fan-out lines do not overlap with each other.

15. The display panel according to claim 1, wherein:

in the first fan-out area, a first sub-fan-out line of part of the first sub-fan-out lines include a first line segment and a second line segment that are connected to each other and arranged in different layers, the first line segment is between the second line segment and a first lead;

a first sub-fan-out line of part of the first sub-fan-out lines includes a third line segment and a fourth line segment that are connected to each other and arranged in different layers, the third line segment is between the fourth line segment and a second lead;

first line segments and third line segments are arranged in different layers, and second line segments and fourth line segments are arranged in different layers; and along a direction perpendicular to a plane where the display panel is located, the first line segments overlap the third line segments, and/or the second line segments overlap the fourth line segments.

16. The display panel according to claim 1, wherein the signal leads in the first wiring area are electrically connected to the signal lines in the display area in a one-to-one correspondence, or the display panel further includes multiplexing units between the first wiring area and the display area, and the signal leads are electrically connected to the signal lines through the multiplexing units.

17. A display device comprising a display panel comprising a display area, a first wiring area, a fan-out area, and a bonding area on a side of the display area along a first direction, wherein:

the first wiring area is between the fan-out area and the display area, and the bonding area is on a side of the fan-out area away from the first wiring area;

the display area includes a plurality of signal lines extending along the first direction and arranged along a second direction, the plurality of signal lines includes M first signal lines and S second signal lines, the first direction intersects the second direction, the first wiring area includes a plurality of signal leads extending along the first direction and arranged along the second direction, the plurality of signal leads includes N first leads and P second leads, the first leads are electrically connected to the first signal lines, the second leads are electrically connected to the second signal lines, M, N, S and P are all integers greater than 1, and $N \leq M$, $P \leq S$;

the fan-out area includes a plurality of fan-out lines including N first fan-out lines and P second fan-out lines, the first fan-out lines are electrically connected to the first leads, the second fan-out lines are electrically connected to the second leads, and at least part of line segments in the first fan-out lines and at least part of line segments in the second fan-out lines are arranged in a same layer;

the display panel further includes a substrate, and a first metal layer and a second metal layer arranged on a same side of the substrate, in the fan-out area, the fan-out lines are distributed in the first metal layer and the second metal layer;

the fan-out area includes a first fan-out area and a second fan-out area, along the first direction, the second fan-out area is on a side of the first fan-out area away from the display area, a same fan-out line includes a first sub-fan-out line in the first fan-out area and a second sub-fan-out line in the second fan-out area that are electrically connected, the fan-out lines include first sub-fan-out lines and second sub-fan-out lines, the first sub-fan-out lines are distributed in the first metal layer and the second metal layer, and the second sub-fan-out lines are in the first metal layer or the second metal layer;

the second sub-fan-out line includes a first sub-line and a second sub-line, first sub-lines are in the first metal layer and second sub-lines are in the second metal layer, or the first sub-lines are in the second metal layer and the second sub-lines are in the first metal layer, and orthographic projections of at least part of the first sub-lines intersect orthographic projections of at least part of the second sub-lines on a plane where the substrate is located; and the bonding area includes a plurality of bonding pads arranged along the second direction, the plurality of bonding pads include N first bonding pads connected to the first fan-out lines and P second bonding pads connected to the second fan-out lines, along the second direction, no floating pads are arranged between adjacent first bonding pads, between adjacent second bonding pads and between adjacent first bonding pads and second bonding pads.

* * * * *